(12) United States Patent
Clovis et al.

(10) Patent No.: US 9,478,268 B2
(45) Date of Patent: Oct. 25, 2016

(54) DISTRIBUTED CLOCK SYNCHRONIZATION

(71) Applicant: QUALCOMM Incorporated, San Diego, CA (US)

(72) Inventors: Philip Michael Clovis, San Diego, CA (US); Yi-Hung Tseng, San Diego, CA (US); Xuhao Huang, San Diego, CA (US); Sushma Chilukuri, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/302,727

(22) Filed: Jun. 12, 2014

(65) Prior Publication Data

US 2015/0364170 A1    Dec. 17, 2015

(51) Int. Cl.
| | |
|---|---|
| *G11C 7/22* | (2006.01) |
| *G11C 7/10* | (2006.01) |
| *G06F 13/42* | (2006.01) |
| *G06F 13/16* | (2006.01) |
| *G11C 29/02* | (2006.01) |
| *H03L 7/081* | (2006.01) |
| *H03L 7/07* | (2006.01) |

(52) U.S. Cl.
CPC ........... *G11C 7/222* (2013.01); *G06F 13/1689* (2013.01); *G06F 13/4243* (2013.01); *G06F 13/4291* (2013.01); *G11C 7/10* (2013.01); *G11C 7/1066* (2013.01); *G11C 7/1093* (2013.01); *G11C 29/022* (2013.01); *G11C 29/023* (2013.01); *G11C 29/028* (2013.01); *H03L 7/0814* (2013.01); *H03L 7/07* (2013.01)

(58) Field of Classification Search
USPC .................................................. 365/189.02
See application file for complete search history.

(56) References Cited

U.S. PATENT DOCUMENTS

| | | | |
|---|---|---|---|
| 6,452,421 B2 | 9/2002 | Saito | |
| 7,126,874 B2* | 10/2006 | Lin ..................... | G11C 7/1006 |
| | | | 365/189.05 |
| 7,127,584 B1 | 10/2006 | Thompson et al. | |
| 7,155,627 B2 | 12/2006 | Matsui | |
| 7,257,725 B2 | 8/2007 | Osaka | |
| 7,272,738 B2 | 9/2007 | Ishikawa | |
| 7,342,521 B1 | 3/2008 | Liu | |
| 7,363,526 B1 | 4/2008 | Chong et al. | |
| 7,469,328 B1* | 12/2008 | Mak ..................... | G06F 13/1689 |
| | | | 711/159 |
| 8,467,486 B2 | 6/2013 | Pyeon | |
| 2004/0236894 A1* | 11/2004 | Grundy ............... | G06F 13/4022 |
| | | | 711/1 |
| 2005/0138458 A1* | 6/2005 | Smith ..................... | G06F 1/12 |
| | | | 713/600 |
| 2009/0154285 A1* | 6/2009 | Pyeon ..................... | G11C 5/025 |
| | | | 365/233.1 |

(Continued)

OTHER PUBLICATIONS

International Search Report and Written Opinion—PCT/US2015/031044—ISA/EPO—Jul. 20, 2015.

*Primary Examiner* — Anthan Tran
*Assistant Examiner* — Mushfique Siddique
(74) *Attorney, Agent, or Firm* — Haynes and Boone, LLP

(57) ABSTRACT

A memory controller is provided that drives data and a corresponding first data strobe to a plurality of endpoints. Each endpoint is configured to register the received data from the memory controller responsive to the first data strobe and then to re-register the received data responsive to a second data strobe. A clock synchronization circuit functions to keep the received first data strobe at one of the endpoints sufficiently synchronous with the second data strobe.

19 Claims, 4 Drawing Sheets

(56) References Cited

U.S. PATENT DOCUMENTS

| | | | |
|---|---|---|---|
| 2011/0063931 A1* | 3/2011 | Linam | G06F 13/1689 365/193 |
| 2011/0239030 A1* | 9/2011 | Ware | G11C 7/04 713/400 |
| 2011/0302385 A1* | 12/2011 | Treichler | G06F 13/1689 711/167 |
| 2013/0083611 A1* | 4/2013 | Ware | G06F 1/3275 365/191 |
| 2013/0249612 A1* | 9/2013 | Zerbe | H04L 7/0079 327/161 |
| 2013/0315014 A1* | 11/2013 | Dearth | G06F 13/1689 365/193 |
| 2014/0052951 A1* | 2/2014 | Kulmala | G06F 3/0656 711/165 |
| 2014/0173325 A1* | 6/2014 | Ryu | G06F 13/1689 713/601 |
| 2014/0347941 A1* | 11/2014 | Jose | G11C 7/222 365/191 |

* cited by examiner

DISTRIBUTED CLOCK SYNCHRONIZATION

TECHNICAL FIELD

This application relates to synchronization of a clock signal and data distributed to multiple endpoints.

BACKGROUND

In source synchronous systems, the data source transmits the data over a data path along with the clock over a clock path to an endpoint. If the clock and data paths are electrically matched (e.g., same wire lengths on paths with the same impedance), whatever skew incurred by the data signal as it propagates on the data path is matched by clock signal as it propagates on the clock path. In this fashion, the clock and data are synchronous at the destination despite any path timing distortion during propagation. As compared to distributed clock-tree techniques, the resulting data speeds for source synchronous transmission are typically much higher. Source synchronous data transmission is thus a popular technique for data transmission on a wide variety of microprocessors and systems-on-a-chip (SOCs).

As the complexity of SOCs increases, more and more sub-components are included that may all be source-synchronous endpoints. The synchronization of so many endpoints becomes very challenging, particularly as data transmission rates are increased. FIG. 1 illustrates a conventional SOC 100 including a memory controller 105 for transmitting source synchronous data to a plurality of endpoints, which may include physical interface modules for communicating with an external memory. For illustration clarity, only a first endpoint 115 and a final nth endpoint 120 are shown in FIG. 1. Each of the n endpoints receives a data signal and a clock signal pair over respective data and clock paths from memory controller 105. In that regard, memory controller 105 interfaces with or includes a clock source such as a PLL 110 that clocks data registers within memory controller 105 and corresponding data registers in the endpoints. The clock and data paths between memory controller 105 and the endpoints are all electrically matched to each other. For example, the path lengths are the same, the path impedances match, and so on. Such matching will in general keep the received clock and data pair synchronous with each other across all the endpoints. However, the distance between memory controller 105 and the endpoints may be relatively large such as several millimeters. To maintain the signal strength over such relatively long propagation paths, each of the data and clock paths may include a plurality of buffers. The buffering and the relatively long propagation paths as well as the inevitable temperature, voltage, and process variations across the die may cause the clock and data signal pairs to become skewed relative to each other and thus no longer phase aligned when received at the various endpoints despite the electrical matching of the clock and data paths. The skew between the data and clock pairs then becomes worse as they are launched from the endpoints to an external memory. At relatively low data rates, the skew may be tolerable in that it may be small as compared to the relatively long periods for the clock frequency at such low data rates. However, as the data rate goes ever higher, the source synchronous transmission shown in FIG. 1 may become untenable due to the errors caused by skew, jitter, and duty cycle distortion.

Accordingly, there is a need in the art for improved clock distribution architectures for systems with multiple source-synchronous endpoints.

SUMMARY

An integrated circuit is provided that includes a source synchronous data source such as a memory controller that transmits data and a corresponding first data strobe to a plurality of endpoints in the integrated circuit. The endpoints and data source may be relatively remote from each other such as separated by a fraction of a millimeter or greater in distance. Given this separation, the data to each endpoint may travel on a corresponding data path from the data source that includes a plurality of buffers to maintain suitable signal amplitude and latency. Similarly, the first data strobe travels from the data source to the endpoints on corresponding clock paths that may include a plurality of buffers.

Each endpoint receives the data from the data source at a demultiplexer that demultiplexes the received data to a plurality of first registers according to a demultiplexing order. For example, in an embodiment having a plurality of n first registers per endpoint (n being an integer greater than one), the demultiplexing order may be to an initial one of the first registers, then to a second one, and so on until a final one of the first registers is selected according to the demultiplexing order. This demultiplexing order is cyclically repeated from the initial through the final one of the first registers. Each first register is clocked by the received first data strobe in a rotating order so as to register the demultiplexed data according to the demultiplexing order.

Each endpoint also includes a multiplexer that selects from a registered output from each of the endpoint's first registers according to a delayed version of the demultiplexing order to form a selected data signal. Each endpoint further includes a second register that registers the selected data signal responsive to a second data strobe.

A clock source generates the second data strobe. This clock source is distributed among all the endpoints such that the second data strobe may be transmitted from the integrated circuits to an external memory in a relatively unskewed fashion along with the registered data from the second registers. This distribution may be accomplished by localizing the clock source or some other distribution method that limits skew and variation. In contrast, the first data strobe is exposed to process, voltage, and temperature variations as it travels on the clock paths from the data source to the endpoints, particularly if these clock paths are relatively long and buffered. To keep the first data strobe synchronous with the second data strobe, the second data strobe is processed in a multi-phase generator to form a multi-phase clock comprising a series of delayed versions of the second data strobe. A selector circuit compares the second data strobe to the received first data strobe for one of the endpoints to generate a phase error. Based upon the phase error, the selector circuit selects from the delayed versions of the second data strobe to form a local clock that will, upon transmission by the data source, become the first data strobe that is phase aligned to the second data strobe at the endpoints.

These advantageous features may be better appreciated with reference to the following detailed description.

BRIEF DESCRIPTION OF THE DRAWINGS

Embodiments of the disclosed clock synchronization system and their advantages are best understood by referring to the detailed description that follows. It should be appreciated that like reference numerals are used to identify like elements illustrated in one or more of the figures.

DETAILED DESCRIPTION

Figure 1:
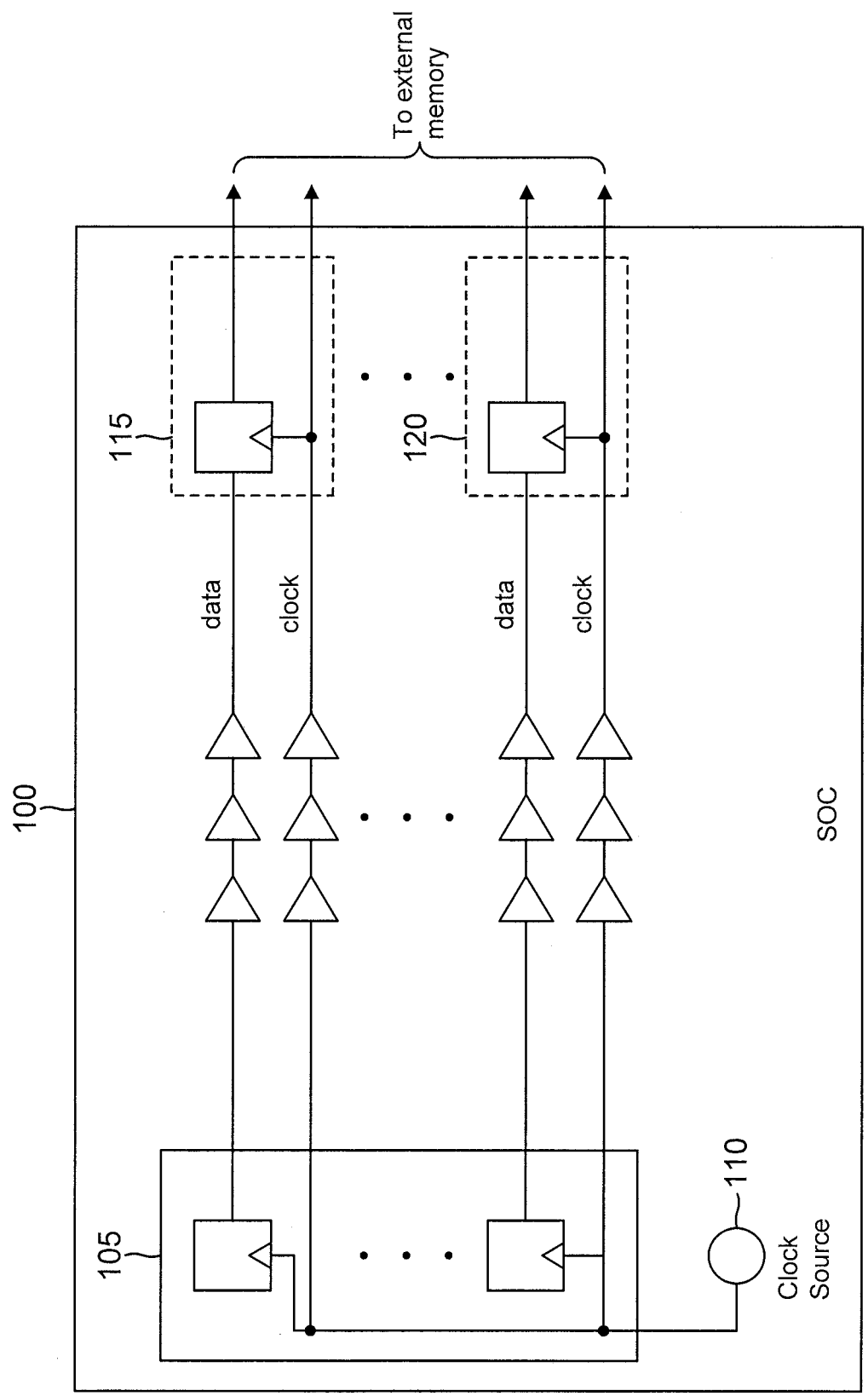
FIG. 1 is a schematic for a conventional source synchronous SOC with multiple endpoints.

A source synchronous architecture is provided in which a plurality of endpoints each includes a plurality of first-clock-domain registers and a second-clock-domain register. For brevity, the first-clock-domain registers will also be denoted herein as first registers. Similarly, the second-clock-domain registers will also be denoted herein as second registers. The first and second clocks are also denoted herein as first and second data strobes, respectively. A data source such as a memory controller transmits data to each endpoint on a corresponding data path. In addition, the memory controller transmits the first data strobe to each endpoint on a corresponding clock path. The data and clock paths to the endpoint may all be electrically matched to each other and are denoted herein as a clock and data path pair for the propagation of a corresponding clock and data signal pair.

Each endpoint may include a demultiplexer for demultiplexing the received data to the endpoint's first registers. A second data strobe source such as a phase-locked loop or crystal oscillator adjacent the endpoints generates the second data strobe that clocks the second register in each endpoint. In contrast to the second registers, the endpoints' first registers are clocked by the first data strobe as received from the memory controller. Each endpoint may also include a multiplexer for selecting from the data outputs from the endpoint's first registers. The demultiplexing and multiplexing within each endpoint allows the registration in the second registers to have a setup and hold time of more than one clock cycle with regard to the registration in the first registers—as will be explained further herein, the first data strobe is kept phase aligned with the second data strobe such that the period (clock cycle duration) for the first and second data strobes is substantially the same. Thus, a setup time of more than one clock cycle need not be distinguished in terms of a first data strobe cycle or a second data strobe cycle. With regard to this setup time, the demultiplexing is cyclical. For example, suppose an endpoint has three first registers, which may be distinguished by the letters A, B, and C. The demultiplexing cycles through the first registers according to a demultiplexing sequence or order such as A, B, C, A, B, C, and so on. The multiplexing of the data outputs from the first registers occurs according to a delayed version of the demultiplexing sequence, with the delay accounting for the desired setup time. For example, the delayed demultiplexing sequence for the embodiment with three first registers distinguished by letters A, B, and C may be B, C, A, B, C, A, and so on while in the same clock cycles the demultiplexing sequence was A, B, C, A, B, C and so on. The third clock cycle is exemplary in that the demultiplexing is writing to register C but the multiplexing then doesn't read register C until the fifth clock cycle. The registration of data in the second register is thus two clock cycles delayed in such an embodiment with regard to the same data being registered in one of the first registers. One the other hand, if the multiplexing order were instead C, A, B, C, A, B, and so on the registration of data in the second register is one clock cycle delayed with regard to the same data being registered in the corresponding first register. The amount of delay in the delayed demultiplexing sequence and thus the setup time may be determined individually in each endpoint. Note that the following discussion referred to the registration of "data" in that memory controller may be sending data words instead of just bits to the respective endpoints. In that regard, each of the first and second registers may be just one-bit wide or may be multiple-bits wide depending upon the word width from the memory controller.

The ability to individually tailor the setup time in each endpoint is quite advantageous in that the clock paths carrying the first data strobe and the corresponding data paths between the memory controller and the endpoints may be relatively long and thus buffered, analogous to the relatively long clock and data paths discussed with regard to SOC 100 of FIG. 1. Temperature, process, and voltage variations across the die thus may cause skew between the first data strobes received at each endpoint despite their synchronous transmission from the memory controller. The amount of delay for the delayed demultiplexing sequence in each endpoint may thus be tailored to account for the varying delay from clock path to clock path for the various endpoints.

To keep the received first data strobe at the endpoints synchronous with the second data strobe, a selector circuit that may be adjacent the second data strobe source may compare the received first data strobe for a selected one of the endpoints to the second data strobe to determine a phase error. A multi-phase generator such as a delay-locked loop may also be located adjacent the second data strobe source. The multi-phase generator generates a multi-phase clock that comprises a series of delayed versions of the second data strobe. The selector circuit selects from the delayed versions responsive to the phase error to form a local clock that is transmitted to and received by the memory controller. The memory controller returns the received local clock as the first data strobe propagated on the clock paths to the endpoints.

In this fashion, the selector circuit applies closed loop control to the received first data strobe at the selected one of the endpoints. Since the first data strobe is distributed from the memory controller to the other endpoints just as it is to the selected endpoint, the received first data strobes for the remaining endpoints are then controlled in an open loop fashion. Such open loop control is accurate, however, since the clock paths to the endpoints may all be electrically matched to each other. Moreover, any skew between the propagation on the clock paths may be accounted for by adjusting the amount of delay in the delayed multiplexing sequence for each of the endpoints. The result is a "distributed clock synchronization" since the received first data strobe at the various endpoints is kept phase aligned with the second data strobe. A synchronous clock (the first data strobe) may thus be transmitted across a die to multiple endpoints and thus be subjected to inevitable skew and distortion yet be kept aligned with a second data strobe that is used for the transmission of the data from the endpoints to an external destination. This alignment is adaptive for each endpoint in that each endpoint may have its own multiplexing order from its first registers to its second register. The setup and hold time at each endpoint with regard to a data registration in one of the first registers according to the first data strobe and a subsequent data registration in the second register according to the second data strobe may thus be customized for each endpoint. Moreover, this solution not only keeps the first data strobe aligned with the second data strobe across the various endpoints but is also inexpensive and low power since it requires just one accurate second data strobe source such as a PLL. These advantages may be better appreciated from the following discussion of example embodiments.

Figure 2:
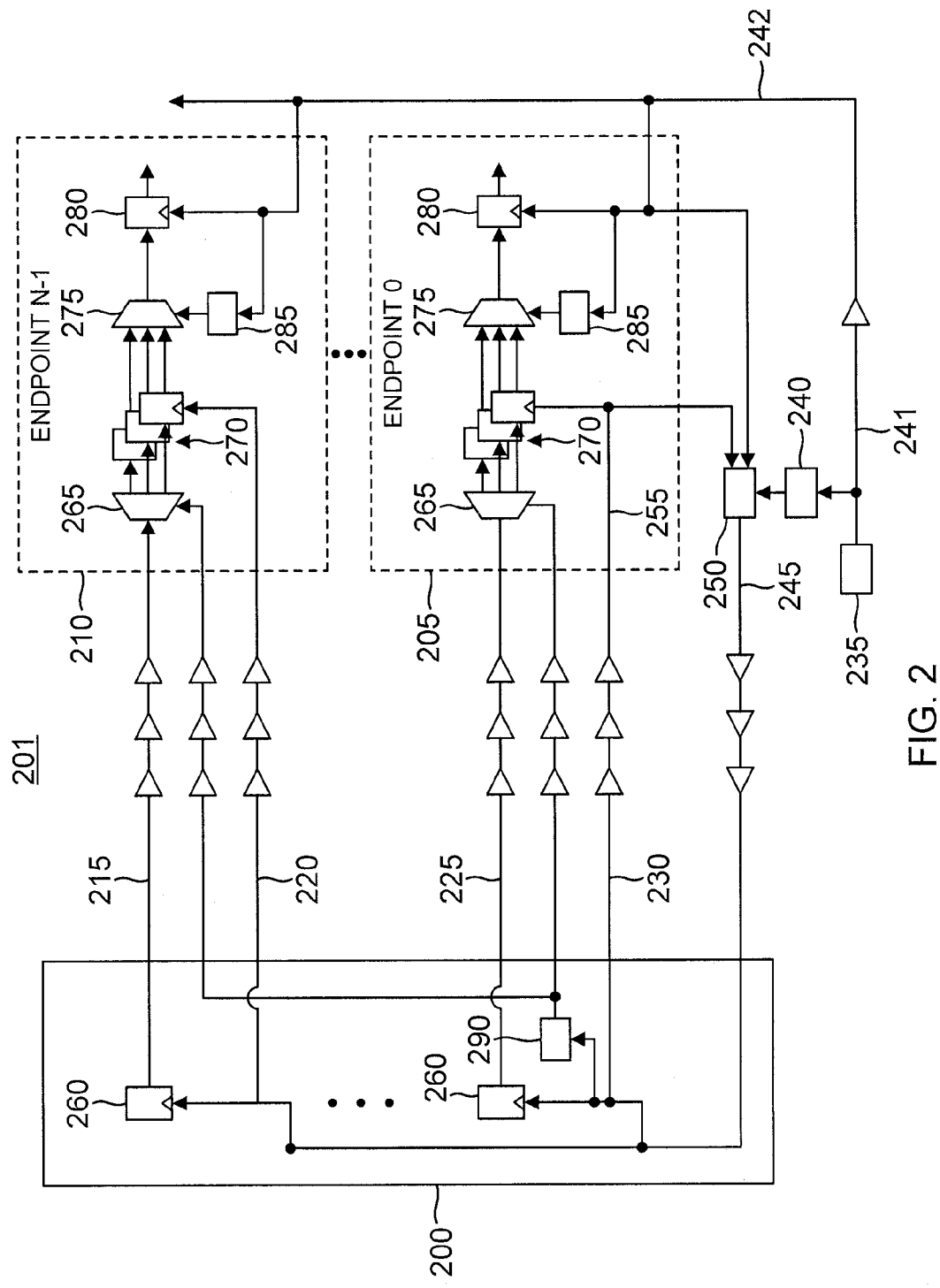
FIG. 2 illustrates a source synchronous architecture in accordance with an embodiment of the disclosure.

As shown for an integrated circuit such as an SOC 201 in FIG. 2, a memory controller 200 drives data to a plurality of n endpoints ranging from an initial zeroth endpoint 205 to a final (n−1)th endpoint 210, where n is an integer greater than one. Each endpoint receives data from memory controller 200 over a corresponding data path. For example, endpoint 210 receives data on data path 215 whereas endpoint 205 receives data on data path 225. It will be appreciated that the data paths may actually comprise data buses such that memory controller 200 transmits data words rather than single bits to each endpoint. For example, in one embodiment, memory controller 200 may transmit byte-wide data words in parallel over the corresponding data paths to the endpoints. The data transmission from memory controller 200 is synchronous with a first data strobe transmitted on corresponding clock paths. For instance, endpoint 210 receives the first data strobe on a clock path 220 whereas endpoint 205 receives the first data strobe on a clock path 230. The data and first data strobe may be single-ended or differential. Similarly, the data transmission may be single-ended or differential as well.

Each data path originates at a corresponding data register 260 in memory controller that is clocked by the first data strobe. Note that the endpoints are typically located near pins or pads (not illustrated) for SOC 201 whereas memory controller 200 may be located relatively remotely within the die from the endpoints. Data paths 215 and 225 as well as the clock paths 220 and 230 may thus extend across SOC 201 for relatively long distances such as a fraction of a millimeter or even multiple millimeters. To maintain the signal strength for such relatively long propagation, data paths 215 and 225 as well as clock paths 220 and 230 may include a plurality of buffers. Although the clock paths 220 and 230 are all electrically matched to each other, the propagation over such relatively long distances and the repeated buffering provides ample opportunity for the first data strobe in one clock path to become skewed, jittered, or duty-cycle distorted with regard to the propagation on other clock paths, particularly in light of the inevitable temperature, process, and voltage variations across the die in which SOC 201 is instantiated.

The resulting clock offsets are problematic in that each endpoint will eventually transfer its received data to an external memory (not illustrated) synchronously according to a second data strobe 242 from a clock source such as a phase-locked loop (PLL) 235. This clock source has very little skew across the various endpoints. Such minimal skew is desirable to satisfy setup and hold times with regard to data transmission from the endpoints to an external destination such as a DRAM relative to a single common clock. PLL 235 generates a second data strobe 241 that may propagate on a buffered clock path to become the received second data strobe 242 at the endpoints. Not only must the received first data strobe in each endpoint be maintained so as to be edge-aligned (synchronous) with second data strobe 242 but each endpoint may require a variable amount of setup time in making the transfer from the first data strobe clock domain to the second data strobe clock domain. To enable an individual tailoring of the setup time in each endpoint, each endpoint in SOC 201 includes a demultiplexer 265 that demultiplexes the received data from memory controller 200 to a plurality of first registers 270 in the endpoint. In SOC 201, each endpoint includes three first registers 270 such that demultiplexers 265 are 3:1 demultiplexers. Alternative embodiments may have more than three first registers 270 such that a 4:1 demultiplexing or greater may be implemented. The greater the amount of demultiplexing (and thus the corresponding number of first registers 270), the larger the amount of setup time that may be selected for in each endpoint at the cost of additional latency. The degree of demultiplexing and thus the number of first registers 270 in each endpoint is thus a tradeoff between setup time and latency.

The demultiplexing by demultiplexers 265 occurs according to a demultiplexing sequence for first registers 270. For example, in a first cycle of the received first data strobe, an endpoint's demultiplexer 265 may select for an initial one of the first registers 270, which would then register the demultiplexed data responsive to the received first data strobe. In a second cycle of the received first data strobe, the same demultiplexer 265 may select for a second one of the first registers 270, which would then register the demultiplexed data responsive to the received first data strobe. Finally, in a third cycle of the received data strobe, the same demultiplexer 265 may select for a remaining third one of the first registers 270. This third one of the first registers 270 would then register the demultiplexed data from demultiplexer 265 responsive to the third cycle of the received first data strobe. One can thus appreciate that the demultiplexing sequence would then be repeated for a fourth cycle through a sixth cycle of the first data strobe, and so on. The demultiplexing sequence may be controlled by a write pointer from a write pointer generator 290 in memory controller 200 that controls demultiplexers 265 to implement a common demultiplexing sequence across the endpoints. Write point generator 290 transmits the write pointer to the endpoints on corresponding write pointer paths that may be buffered similarly to the clock and data paths.

Although the demultiplexing is common to the endpoints in SOC 201, the setup time may be individually tailored. To enable this individual tailoring, each endpoint may include a read pointer generator 285 that controls a multiplexer 275 with a read pointer to select from the registered outputs from each of the endpoint's first registers 270. The selected registered output is re-registered in a second register 280 responsive to second data strobe 242. The multiplexing occurs according to a delayed version of the demultiplexing sequence with the amount of delay controlled by each read pointer generator 285. For example, suppose the demultiplexing sequence across the first registers 270 was the initial, second, third, initial, second, third, and so on sequence discussed earlier. Depending upon the desired amount of setup time, multiplexer 275 in an endpoint may be selecting from the initial one of first registers 270 in a given cycle of the received first data strobe while demultiplexer 265 is writing to the third one of first registers 270. In a subsequent cycle of the received first data strobe, multiplexer 275 would then select for the second one of first registers 270 while demultiplexer 265 is writing to the first one of registers 270, and so on. There would then be one clock cycle of latency for the setup time. Alternatively, the clock path phasing for another endpoint may be such that two clock cycles of latency (setup time) is necessary. In this fashion, the delay differences for the various clock paths such as clock paths 230 and 220 may be compensated for such that the received first data strobe at each endpoint remains synchronous to second data strobe 242. To train the read pointers from read pointer generators 285, memory controller 200 may transmit training sequences to the various endpoints so that the phase differences between the clock paths may be determined. Based upon these differences, memory controller 200 (or another suitable controller) may then adjust read pointer generators 285 accordingly. Each read pointer determines the delay offset from the demultiplexing sequence established by write pointer generator 290. But note that write pointer generator 290 cycles through the demultiplexing sequence responsive to cycles of the first data strobe whereas read pointer generators 285 cycle through their delayed versions of the demultiplexing sequence responsive to cycles of second data strobe 242.

In one embodiment, demultiplexer 265, first registers 270, multiplexer 275, and second register 280 may be deemed to comprise a means within each endpoint for varying a setup time between registering data from the memory controller according to a received first data strobe from the memory controller and registering the data according to the second data strobe.

The data transfer between the first data strobe domain to the second data strobe domain at the endpoints requires the received first data strobe at each endpoint to be sufficiently synchronous with second data strobe 242. To maintain this synchronicity, the received data strobe for a given one of the endpoints such as a received first data strobe 255 at endpoint 205 is compared to second data strobe 242 at a selector circuit 250 to determine a phase error between these two clocks. At the same time, a multi-phase clock generator 240 such as a delay-locked loop (DLL) generates a multi-phase clock from second data strobe 241 (second data strobe 242 being what is received at endpoint 205 from the propagation of second data strobe 241) as produced by PLL 235. The multi-phase clock comprises a series of delayed versions of second data strobe 241.

Based upon the phase error, selector circuit 250 selects from the delayed versions of second data strobe 241 to produce a local clock that is driven out on a local clock path 245 to memory controller 200 where it is received as the first data strobe for clocking registers 260 and write counter 290 as well as for retransmission to the endpoints. Clock paths 245 and 230 thus form a single overall clock path with respect to each first register 270 in endpoint 205. Each such clock path has one end at selector circuit 250 and another end at the corresponding first register 270 in endpoint 205. There is thus a closed loop control to maintain the synchronicity of received first data strobe 255 at endpoint 205 with second data strobe 242. The received first data strobes at the remaining endpoints such as endpoint 210 are then controlled in an open loop fashion but satisfy sufficient setup and hold timing requirements due to the previously-described customizing of setup and hold time at each endpoint. Each endpoint can thus transmit its registered data in second registers 280 to an external memory synchronously with second data strobe 242. Since PLL 235 may be located relatively close to the endpoints and thus also relatively close to the pins or pads from which the data leaves SOC 201 to propagate to the external memory, second data strobe 242 is exposed to relatively little skew, jitter, and duty-cycle distortion before it is received by the external memory. In this fashion, high-speed data transmission to the external memory may occur with acceptable error rates. In contrast, the received first data strobes at the endpoints are exposed to skew, jitter, and duty-cycle distortion due to the relatively long and buffered clock paths such as paths 220 and 230 between memory controller 200 and the corresponding endpoints. The received first data strobes are thus relatively "dirty" compared to the "clean" second data strobe 242. But these differences are accommodated by the variable setup time in each endpoint and also by the closed loop control as applied by selector circuit 250 and multi-phase clock generator 240. Selector circuit 250 and multi-phase clock generator 240 form a clock synchronization circuit that keeps the received first data strobe at one of the endpoints sufficiently synchronous with second data strobe 242.

Figure 3:
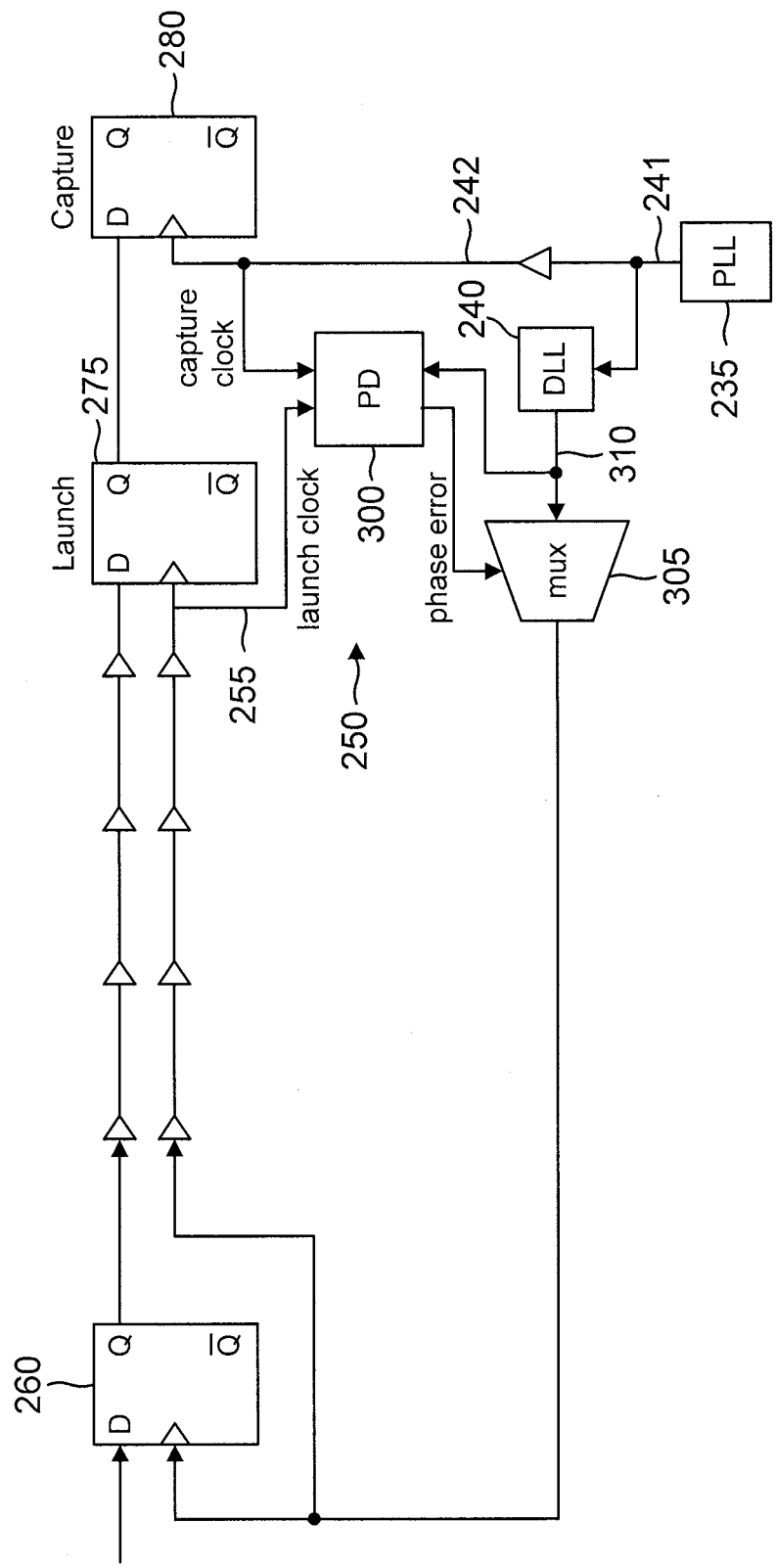
FIG. 3 illustrates additional details for the local clock synchronization performed in the source-synchronous architecture of FIG. 2.

This closed loop control by the clock synchronization circuit may be better appreciated with reference to FIG. 3. In this embodiment, selector circuit 250 comprises a multi-phase detector 300 and a multiplexer 305. PLL 235 and DLL 240 operate as discussed with regard to FIG. 2 to generate a multi-phase clock 310 that is received by multi-phase detector 300 and selected from by multiplexer 305. Only register 260 from memory controller 200 of FIG. 2 is shown in FIG. 3. Similarly, only a single first register 275 as well as second register 280 from endpoint 205 of FIG. 2 are shown in FIG. 3. The remaining endpoints and the remainder of memory controller 200 are not shown in FIG. 3 for illustration clarity. Received first data strobe 255 may also be denoted as a launch clock as the data registered at second registers 280 is launched from first register 275 with regard to received first data strobe 255. Second data strobe 242 may also be denoted as a capture clock in that it is in second register 280 where the data is captured and transferred into the second data strobe clock domain.

Multi-phase clock 310 comprises a plurality m of delayed versions (not illustrated) of the second data strobe ranging from a first delayed clock that is phase shifted with regard to the second data strobe by a phase shift $\phi$ to a final mth delayed clock $\phi_m$ that is phase shifted with regard to the second data strobe by a phase shift $m\phi$, where m is an integer greater than one. Each successive delayed clock within multi-phase clock 310 is phase shifted by $\phi$ with regard to the preceding delayed clock. For example, a second delayed clock $\phi_2$ is phase shifted by $\phi$ with regard to the first delayed clock $\phi_1$. Similarly, a third delayed clock $\phi_2$ is phase shifted by $\phi$ with regard to the second delayed clock $\phi_2$. The mth delayed clock $\phi_m$ is thus phase shifted by $\phi$ with regard to an (m−1)th delayed clock $\phi_{m-1}$.

To generate the m delayed clocks that form multi-phase clock 310, DLL 240 may include a delay line (not illustrated) having a plurality m of delay elements matching the plurality m of delayed clocks. It is convenient for the integer m to be a power of two as will be explained further herein. In one embodiment, m may thus equal $2^4=16$ such that the delay elements in the delay line in DLL 240 range from a zeroth delay element to a fifteenth delay element. A buffering delay element at the beginning of the delay line may receive the second data strobe and delay the second data strobe into a buffered clock dinp that drives the zeroth delay element. Note that the clocks discussed herein such as the first and second data strobes may comprise differential or single-ended clock signals.

Each delay element produces a corresponding delayed clock as part of multi-phase clock 310. In an embodiment with sixteen delay elements in the delay line for DLL 240, multi-phase clock 310 may be represented as d<0:15>. For example, the zeroth delay element in the delay line produces delayed clock d<0> whereas the final fifteenth delay element produces delayed clock d<15>. Similarly, an ith delay element in the delay line (where i is an integer ranging from 0 to 15) produces an ith delayed clock d<i>. DLL 240 implements a control loop to keep d<15> in phase with the buffered input clock dinp to the delay line. In this fashion, a period T for the second data strobe is sampled in a sixteen-delay-element embodiment for the delay line in DLL 240 at sixteen equally distributed points such that an ith delayed clock d<i> in multi-phase clock 310 has a rising edge that is delayed by T/16 with regard to the rising edge of a delayed clock d<i−1>. For example, the rising edge of d<1> is delayed by T/16 with regard to the rising edge of d<0>. Similarly, the rising edge of d<2> is delayed by 2T/16 with regard to the rising edge of d<0>, and so on.

Multi-phase detector 300 may represent the phase error between received first data strobe 255 and second data strobe 242 as a digital code that selects for a selected one of delayed clocks in multi-phase clock 310 at multiplexer 305. Multiplexer 305 launches the selected delayed clock as a local clock that propagates to the memory controller (not illustrated) to clock its data registers 260 and also be transmitted to the endpoint as the first data strobe. Analogous to multiplexer 305, multi-phase detector 300 also receives multi-phase clock 310 so that these delayed clocks may be used to determine a phase for second data strobe 242 and to determine a phase for received first data strobe 255. For example, multi-phase detector 300 may include a flip-flop (not illustrated) for each delayed clock in multi-phase clock 310. In an embodiment having 16 delayed clocks d<0:15>, multi-phase detector 300 may thus include 16 flip-flops that may be used in a serial fashion to determine the phase for second data strobe 242 and received first data strobe 255.

Alternatively, multi-phase detector 300 may include thirty-two flip-flops (one set of sixteen for analyzing second data strobe 242 and another set of sixteen flip-flops for analyzing received first data strobe 255) in an embodiment in which multi-phase clock 310 comprises sixteen delayed clocks d<0:15>. Referring again to a serial embodiment, each flip-flop may be triggered by a clock edge (e.g., a rising clock edge) in the corresponding clock signal being analyzed. For example, suppose second data strobe 242 triggers sixteen flip-flops in multi-phase detector 300 corresponding to the sixteen delayed clocks d<0:15>. A zeroth flip-flop registers d<0>, a first flip-flop registers d<1>, and so on such that a sixteenth flip-flop registers d<15>.

Depending upon the phasing of the second data strobe 242 upon reception at multi-phase detector 300, the various flip-flops would either register a logic high or a logic low value. The registered values in the flip-flops may thus be used as a digital word by multi-phase detector 300 that represents the phase of second data strobe 242. The flip-flops could then be reset (in a serial embodiment) so that the phase of received first data strobe 255 could be determined analogously such that the flip-flops would then be clocked by the corresponding clock edge in received first data strobe 255. As a result, multi-phase detector 300 can compare the two resulting digital words (one representing the phase of second data strobe 242 and another representing the phase of received first data strobe 255) to determine a digital phase error. For example, multi-phase detector 240 could subtract the two digital words to determine the digital phase error. It is thus efficient for such a binary digital coding of the phase error for the selection at multiplexer 305 to then be from number of delayed clocks in multi-phase clock 310 that equals a power of two. However, it will be appreciated that the number of delayed clocks need not be a power of two in alternative embodiments.

Note that prior to the phase calculations, multiplexer 305 must have launched the local clock or there would be no received first data strobe 255 to measure. The digital phase error could thus have a default value such as all binary zeroes to select for a default delayed clock such as d<0>. With the default delayed clock launched as the local clock from multiplexer 305 during a detection phase of operation, multi-phase detector 300 may thus commence with a phase measurement during a measurement mode of operation to determine the digital phase error accordingly.

The phase correction applied by multi-phase detector 300 may be relative to the default delayed clock. Prior to the phase measurement, the default delayed clock propagates through the memory controller and returns as received first data strobe 255 having some delay offset with regard to second data strobe 242. If multiplexer 305 could thus launch a delayed clock d<i> that has a rising edge advanced by the same delay offset with regard to the default delayed clock, received first data strobe 255 will then be edge aligned with second data strobe 242. More generally, suppose the default clock is d<i> in an embodiment with m delayed clocks making up multi-phase clock 310. In addition, suppose that the phase measurement by multi-phase detector 300 indicates that received first data strobe 255 is delayed by n delay increments with regard to second data strobe 242 (each delay increment equaling T/m). The selected delayed clock at multiplexer 305 in such a case would be d<[(i−n)modulo m]>.

Such a phase alignment is quite advantageous in that multi-phase detector 300 requires just a few clock cycles to make the phase measurements and adjustment. At a clock rate of 1 GHz, that is just a few nanoseconds. In contrast, a conventional use of a PLL to align received first data strobe 255 with second data strobe 242 would require tens of microseconds or longer, which is orders of magnitude slower. In addition, the digital circuitry within multi-phase detector 300 such as the flip-flops discussed earlier is relatively compact and low power. Similarly, multiplexer 305 also requires relatively few transistors to construct. In contrast, a PLL is considerably bulkier and consumes substantially more power.

Figure 4:
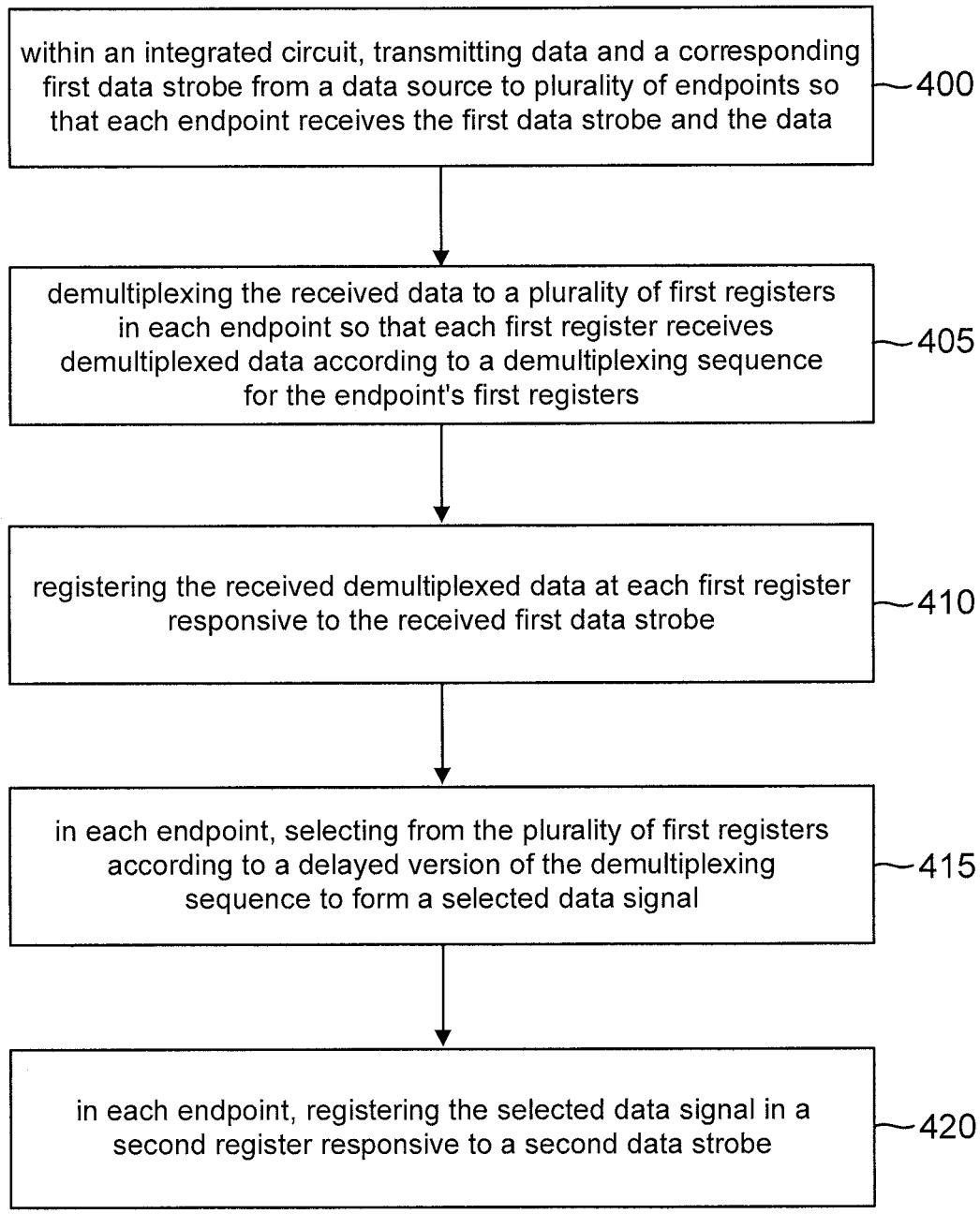
FIG. 4 is a flowchart of an example method of operation in accordance with an embodiment of the disclosure.

A method of operation for an integrated circuit including the distributed clock synchronization architecture disclosed herein will now be discussed with regard to the flowchart shown in FIG. 4. A first act 400 comprises transmitting data and a corresponding first data strobe from a data source to plurality of endpoints so that each endpoint receives the first data strobe and the data. The transmission of the first data strobe on clock paths 220 and 230 and the data on data paths 215 and 225 discussed with regard to SOC 201 of FIG. 2 is an example of such an act. The method also includes an act 405 of demultiplexing the received data to a plurality of first registers in each endpoint so that each first register receives demultiplexed data according to a demultiplexing sequence for the endpoint's first registers and an act 410 of registering the received demultiplexed data at each first register responsive to the received first data strobe. The demultiplexing at demultiplexers 265 to corresponding first registers 270 discussed with regard to SOC 201 are examples of these acts.

In addition, the method includes an act 415 of selecting from the plurality of first registers in each endpoint according to a delayed version of the demultiplexing sequence to form a selected data signal for the endpoint and an act 420 of, in each endpoint, registering the endpoint's selected data signal in a second register responsive to a second data strobe. The multiplexing at multiplexers 275 and subsequent registration in second registers 280 are examples of these acts.

As those of some skill in this art will by now appreciate and depending on the particular application at hand, many modifications, substitutions and variations can be made in and to the materials, apparatus, configurations and methods of use of the devices of the present disclosure without departing from the spirit and scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

We claim:

1. An integrated circuit, comprising:
   a clock source configured to provide a second data strobe;
   a memory controller configured to transmit a first data strobe derived from the second data strobe; and
   a plurality of endpoints, wherein each endpoint includes:
      a plurality of first registers;
      a demultiplexer configured to demultiplex data so that each first register receives demultiplexed data according to a demultiplexing sequence, and wherein each first register is configured to register the demultiplexed data received from the demultiplexer responsive to the first data strobe;
      a multiplexer configured to select a data output from each of the endpoint's first registers according to a delayed version of the demultiplexing sequence; and
      a second register configured to register the selected data output from the multiplexer responsive to the second data strobe, wherein each endpoint is configured to transmit its registered selected data output to an external memory responsive to the second data strobe,
   wherein the memory controller includes a write pointer configured to control the demultiplexing sequence at each of the demultiplexers.

2. The integrated circuit of claim 1, wherein the plurality of first registers in each endpoint comprises three first registers.

3. The integrated circuit of claim 1, wherein the plurality of first registers in each endpoint comprises four first registers.

4. The integrated circuit of claim 1, wherein each endpoint further comprises a read pointer configured to control the delayed version of the demultiplexing sequence at the endpoint's multiplexer.

5. The integrated circuit of claim 1, further comprising:
   a plurality of data paths corresponding to the plurality of endpoints, wherein each data path extends from the memory controller to the demultiplexer at the corresponding endpoint, the memory controller being configured to transmit data on each data path to the corresponding endpoint's demultiplexer;
   a plurality of clock paths corresponding to the plurality of endpoints, wherein each clock path extends from the memory controller to each of the first registers in the corresponding endpoint, the memory controller being configured to transmit the first data strobe to each endpoint on the corresponding clock path.

6. The integrated circuit of claim 5, wherein the data paths and the clock paths are all electrically matched to each other.

7. The integrated circuit of claim 1, wherein the clock source comprises a phase-locked loop (PLL).

8. The integrated circuit of claim 1, further comprising:
   a multi-phase clock generator configured to receive the second data strobe and to generate a plurality of delayed clocks, each delayed clock having a unique delay with regard to the second data strobe; and
   a selector circuit configured to select one of the delayed clocks based upon a phase error, the selector circuit being further configured to launch the selected one of the delayed clocks to the memory controller, wherein the memory controller is configured to use the received selected delayed clock as the first data strobe, the selector circuit being further configured to compare the received first data strobe at one of the endpoints to the second data strobe to determine the phase error.

9. The integrated circuit of claim 8, wherein the selector circuit includes a multiplexer for selecting the selected one of the delayed clocks responsive to the phase error.

10. The clock synchronization circuit of claim 8, wherein the selector circuit includes a multi-phase detector configured to compare the received local clock to the plurality of delayed clocks to determine a first digital word and to compare the reference clock to the plurality of delayed clocks to determine a second digital word, and wherein the multi-phase detector is further configured to compare the first and second digital words to determine the phase error.

11. The clock synchronization circuit of claim 8, wherein the multi-phase clock generator comprises a delay-locked loop (DLL).

12. A method, claiming:
    deriving a first data strobe from a second data strobe provided by a clock source;
    within an integrated circuit, transmitting data and the first data strobe and a write pointer from a memory controller to a plurality of endpoints so that each endpoint receives the first data strobe and the data;
    demultiplexing the received data to a plurality of first registers in each endpoint so that each first register receives demultiplexed data according to a demultiplexing sequence for the endpoint, wherein the demultiplexing sequence is coordinated according to the write pointer;
    registering the received demultiplexed data at each first register responsive to the received first data strobe and according to the endpoint's multiplexing sequence;
    selecting from the plurality of first registers in each endpoint according to a delayed version of the endpoint's demultiplexing sequence to form a selected data signal for the endpoint;
    in each endpoint, registering the endpoint's selected data signal in a second register responsive to the second data strobe; and
    from each endpoint, transmitting the registered selected data signal from the second register to an external memory responsive to the second data strobe.

13. The method of claim 12, further comprising:
    generating a plurality of delayed clocks such that each delayed clock has a unique delay with regard to the second data strobe;
    selecting from the plurality of delayed clocks responsive to a phase error to form a selected delayed clock;
    driving the selected delayed clock into a first end of a clock path;
    responsive to driving the selected delayed clock into the first end of the clock path, receiving the first data strobe from a second end of the clock path at one of the first registers; and
    comparing the received first data strobe from the second end of the clock path to the second data strobe to determine the phase error.

14. The method of claim 12, wherein the demultiplexing is at least a 1:3 demultiplexing.

15. The method of claim 12, wherein the demultiplexing is at least a 1:4 demultiplexing.

16. The method of claim 12, wherein the selecting in each endpoint is at least a 3:1 multiplexing.

17. The method of claim 12, wherein the selecting in each endpoint is at least a 4:1 multiplexing.

18. An integrated circuit, comprising:
- a memory controller configured to provide a first data strobe derived from a second data strobe; and
- a plurality of endpoints, wherein each endpoint includes:
  - a plurality of first registers configured to register data from the memory controller responsive to the first data strobe; and
  - a second register configured to register the data from the first register responsive to the second data strobe; and
- a multi-phase clock generator configured to receive the second data strobe and to generate a plurality of delayed clocks, each delayed clock having a unique delay with regard to the second data strobe; and
- a selector circuit configured to select one of the delayed clocks based upon a phase error, the selector circuit being further configured to launch the selected one of the delayed clocks to the memory controller, wherein the memory controller is configured to transmit the selected delayed clock to the endpoints as the first data strobe, the selector circuit being further configured to compare the received first data strobe at one of the endpoints to the second data strobe to determine the phase error, wherein the multi-phase clock generator comprises a delay-locked loop.

19. The integrated circuit of claim 18, wherein the plurality of first registers in each endpoint comprises at least three first registers.

* * * * *